US011580044B2

(12) United States Patent
Brewer

(10) Patent No.: US 11,580,044 B2
(45) Date of Patent: Feb. 14, 2023

(54) NETWORK CREDIT RETURN MECHANISMS

(71) Applicant: Micron Technology, Inc., Boise, ID (US)

(72) Inventor: Tony Brewer, Plano, TX (US)

(73) Assignee: Micron Technology, Inc., Boise, ID (US)

(*) Notice: Subject to any disclaimer, the term of this patent is extended or adjusted under 35 U.S.C. 154(b) by 16 days.

(21) Appl. No.: 17/007,814

(22) Filed: Aug. 31, 2020

(65) Prior Publication Data

US 2022/0066967 A1    Mar. 3, 2022

(51) Int. Cl.
*G06F 13/00* (2006.01)
*G06F 13/364* (2006.01)
*G06F 30/3953* (2020.01)

(52) U.S. Cl.
CPC ........ *G06F 13/364* (2013.01); *G06F 30/3953* (2020.01)

(58) Field of Classification Search
CPC ..... G06F 13/00; G06F 13/364; G06F 30/3953
See application file for complete search history.

(56) References Cited

U.S. PATENT DOCUMENTS

| 6,515,963 | B1 | 2/2003 | Bechtolsheim et al. |
| 7,042,842 | B2 | 5/2006 | Paul et al. |
| 7,103,672 | B1 | 9/2006 | Sharma |
| 9,515,961 | B2 | 12/2016 | Guo et al. |
| 10,671,554 | B1 | 6/2020 | Bharadwaj |
| 11,356,378 | B2 | 6/2022 | Brewer et al. |
| 11,362,939 | B2 | 6/2022 | Brewer |
| 2003/0193927 | A1 | 10/2003 | Hronik |
| 2006/0056292 | A1 | 3/2006 | Mayhew et al. |
| 2007/0233918 | A1 | 10/2007 | Check et al. |

(Continued)

FOREIGN PATENT DOCUMENTS

| WO | WO-2022046252 A1 | 3/2022 |
| WO | WO-2022046253 A1 | 3/2022 |

(Continued)

OTHER PUBLICATIONS

"International Application Serial No. PCT/US2021/038392, International Search Report dated Oct. 5, 2021", 3 pgs.

(Continued)

*Primary Examiner* — Henry Tsai
*Assistant Examiner* — Kim T Huynh
(74) *Attorney, Agent, or Firm* — Schwegman Lundberg & Woessner, P.A.

(57) ABSTRACT

Implementations of the present disclosure are directed to systems and methods for reducing design complexity and critical path timing challenges of credit return logic. A wide bus supports simultaneous transmission of multiple flits, one per lane of the wide bus. A source device transmitting flits on a wide bus selects from among multiple credit return options to ensure that only one of the multiple flits being simultaneously transmitted includes a credit return value. In some example embodiments, the receiving device checks only the flit of one lane of the wide bus (e.g., lane 0) for credit return data. In other example embodiments, the receiving device uses a bitwise-OR to combine the credit return data of all received flits in a single cycle.

20 Claims, 9 Drawing Sheets

(56) References Cited

U.S. PATENT DOCUMENTS

| | | |
|---|---|---|
| 2008/0189504 A1 | 8/2008 | Hughes |
| 2009/0055496 A1 | 2/2009 | Garg et al. |
| 2010/0146162 A1 | 6/2010 | Wagh et al. |
| 2010/0158023 A1 | 6/2010 | Mukhopadhyay et al. |
| 2011/0032947 A1 | 2/2011 | Brueggen |
| 2013/0051397 A1* | 2/2013 | Guo ............... H04L 45/586 370/400 |
| 2015/0109024 A1 | 4/2015 | Abdelfattah et al. |
| 2016/0179427 A1* | 6/2016 | Jen ................. G06F 3/0625 711/147 |
| 2016/0188500 A1* | 6/2016 | Morris ........... G06F 13/1673 711/154 |
| 2016/0283375 A1* | 9/2016 | Das Sharma ..... G06F 12/0806 |
| 2016/0299699 A1 | 10/2016 | Vanaraj et al. |
| 2017/0026300 A1* | 1/2017 | Rimmer ............ H04L 47/765 |
| 2017/0091108 A1 | 3/2017 | Arellano et al. |
| 2017/0109315 A1* | 4/2017 | Safranek ............. G06F 8/71 |
| 2017/0195245 A1 | 7/2017 | Bhatia et al. |
| 2018/0004702 A1 | 1/2018 | Pappu et al. |
| 2018/0011759 A1* | 1/2018 | Willey ............. G06F 13/4282 |
| 2018/0039593 A1* | 2/2018 | Debbage ............. G06F 13/28 |
| 2018/0188998 A1 | 7/2018 | Shaharabany et al. |
| 2019/0065086 A1 | 2/2019 | Margetts et al. |
| 2019/0243700 A1 | 8/2019 | Brewer |
| 2019/0278522 A1 | 9/2019 | Moon et al. |
| 2019/0324928 A1 | 10/2019 | Brewer |
| 2019/0340019 A1 | 11/2019 | Brewer |
| 2019/0340020 A1 | 11/2019 | Brewer |
| 2019/0340023 A1 | 11/2019 | Brewer |
| 2019/0340024 A1 | 11/2019 | Brewer |
| 2019/0340027 A1 | 11/2019 | Brewer |
| 2019/0340035 A1 | 11/2019 | Brewer |
| 2019/0340154 A1 | 11/2019 | Brewer |
| 2019/0340155 A1 | 11/2019 | Brewer |
| 2020/0050398 A1 | 2/2020 | Meyerowitz et al. |
| 2020/0067814 A1* | 2/2020 | Zheng ............... H04L 45/127 |
| 2020/0081857 A1 | 3/2020 | Barner |
| 2020/0116783 A1 | 4/2020 | Kalva et al. |
| 2020/0183869 A1 | 6/2020 | Mikos |
| 2021/0029062 A1 | 1/2021 | Shan et al. |
| 2021/0117350 A1 | 4/2021 | Safranek et al. |
| 2022/0070089 A1 | 3/2022 | Brewer |
| 2022/0070107 A1 | 3/2022 | Pospesel |
| 2022/0070108 A1 | 3/2022 | Brewer et al. |
| 2022/0122668 A1* | 4/2022 | Brewer ............... G11C 16/08 |
| 2022/0263769 A1 | 8/2022 | Brewer et al. |
| 2022/0278924 A1 | 9/2022 | Brewer |

FOREIGN PATENT DOCUMENTS

| | | |
|---|---|---|
| WO | WO-2022046254 A1 | 3/2022 |
| WO | WO-2022046255 A1 | 3/2022 |

OTHER PUBLICATIONS

"International Application Serial No. PCT/US2021/038392, Written Opinion dated Oct. 5, 2021", 3 pgs.

"International Application Serial No. PCT/US2021/038401, International Search Report dated Sep. 17, 2021", 3 pgs.

"International Application Serial No. PCT/US2021/038401, Written Opinion dated Sep. 17, 2021", 4 pgs.

"International Application Serial No. PCT/US2021/038407, International Search Report dated Oct. 12, 2021", 4 pgs.

"International Application Serial No. PCT/US2021/038407, Written Opinion dated Oct. 12, 2021", 5 pgs.

"International Application Serial No. PCT/US2021/038413, International Search Report dated Oct. 5, 2021", 3 pgs.

"International Application Serial No. PCT/US2021/038413, Written Opinion dated Oct. 5, 2021", 4 pgs.

"U.S. Appl. No. 17/007,468, Notice of Allowance dated Feb. 28, 2022", 11 pgs.

"U.S. Appl. No. 17/007,516, Final Office Action dated May 13, 2022", 13 pgs.

"U.S. Appl. No. 17/007,516, Non Final Office Action dated Mar. 1, 2022", 14 pgs.

"U.S. Appl. No. 17/007,516, Response filed Apr. 22, 2022 to Non Final Office Action dated Mar. 1, 2022", 10 pgs.

"U.S. Appl. No. 17/007,516, Response filed Jul. 13, 2022 to Final Office Action dated May 13, 2022", 11 pgs.

"U.S. Appl. No. 17/007,701, Examiner Interview Summary dated Jan. 13, 2022", 3 pgs.

"U.S. Appl. No. 17/007,701, Notice of Allowance dated Feb. 8, 2022", 7 pgs.

"U.S. Appl. No. 17/007,701, Response filed Jan. 18, 2022 to Final Office Action dated Nov. 22, 2021", 9 pgs.

U.S. Appl. No. 17/007,516, filed Aug. 31, 2020, Early Credit Return for Credit-Based Flow Control.

U.S. Appl. No. 17/007,701, filed Aug. 31, 2020, Combined Write Enable Mask and Credit Return Field.

U.S. Appl. No. 17/007,468, filed Aug. 31, 2020, Flow Control for a Multiple Flow Control Unit Interface.

* cited by examiner

NETWORK CREDIT RETURN MECHANISMS

STATEMENT REGARDING GOVERNMENT SUPPORT

This invention was made with U.S. Government support under Agreement No. HR00111830003, awarded by DARPA. The U.S. Government has certain rights in the invention.

TECHNICAL FIELD

Embodiments of the disclosure relate generally to network protocols and more specifically to networking using simplified credit return logic. In specific examples, the protocols may be implemented to manage network communications in a chiplet-based system.

BACKGROUND

A sending device using a credit-based flow control system reduces its available credits before sending data to a receiving device. The receiving device buffers the data. After the data is removed from the buffer and processed, the receiving device sends a responsive message to the sending device. In response to receiving the responsive message, the sending device increases its available credits.

Chiplets are an emerging technique for integrating various processing functionality. Generally, a chiplet system is made up of discrete chips (e.g., integrated circuits (ICs) on different substrate or die) that are integrated on an interposer and packaged together. This arrangement is distinct from single chips (e.g., ICs) that contain distinct device blocks (e.g., intellectual property blocks) on one substrate (e.g., single die), such as a system-on-a-chip (SoC), or discretely packaged devices integrated on a board. In general, chiplets provide better performance (e.g., lower power consumption, reduced latency, etc.) than discretely packaged devices, and chiplets provide greater production benefits than single die chips. These production benefits can include higher yields or reduced development costs and time.

Chiplet systems are generally made up of one or more application chiplets and support chiplets. Here, the distinction between application and support chiplets is simply a reference to the likely design scenarios for the chiplet system. Thus, for example, a synthetic vision chiplet system can include an application chiplet to produce the synthetic vision output along with support chiplets, such as a memory controller chiplet, sensor interface chiplet, or communication chiplet. In a typical use case, the synthetic vision designer can design the application chiplet and source the support chiplets from other parties. Thus, the design expenditure (e.g., in terms of time or complexity) is reduced by avoiding the design and production of functionality embodied in the support chiplets. Chiplets also support the tight integration of intellectual property blocks that can otherwise be difficult, such as those using different feature sizes. Thus, for example, devices designed during a previous fabrication generation with larger feature sizes, or those devices in which the feature size is optimized for the power, speed, or heat generation—as can happen with sensors—can be integrated with devices having different feature sizes more easily than attempting to do so on a single die. Additionally, by reducing the overall size of the die, the yield for chiplets tends to be higher than that of more complex, single die devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Implementations of the present disclosure are directed to systems and methods for reducing design complexity and critical path timing challenges of credit return logic. A wide bus supports simultaneous transmission of multiple flits, one per lane of the wide bus. A source device transmitting flits on a wide bus selects from among multiple credit return options to ensure that only one of the multiple flits being simultaneously transmitted includes a credit return value. In some example embodiments, the receiving device checks only the flit of one predetermined lane of the wide bus (e.g., lane 0) for credit return data and the transmitting device uses only the predetermined lane to transmit credit return data. In other example embodiments, the receiving device uses a bitwise-OR to combine the credit return data of all received flits in a single cycle and the transmitting device uses any one late to transmit credit return data. When the default credit return value is all zeroes, the bitwise-OR results in just the credit return data of the flit containing credit return data, regardless of which lane the credit return data is carried in.

Among the benefits of implementations of the present disclosure is that additional circuitry (such as adders to sum the credits returned by each lane) is not used, reducing the design complexity and avoiding the addition of delays in the critical path of the receiver. Processing cycles expended in transferring, receiving, and processing credit return data are reduced. Additionally, power consumed in performing the processing is reduced. Performance of the system comprising the communicating devices is also improved as a result of the reduced networking overhead. Other benefits will be evident to those of skill in the relevant art having the benefit of this disclosure.

Figure 1A:
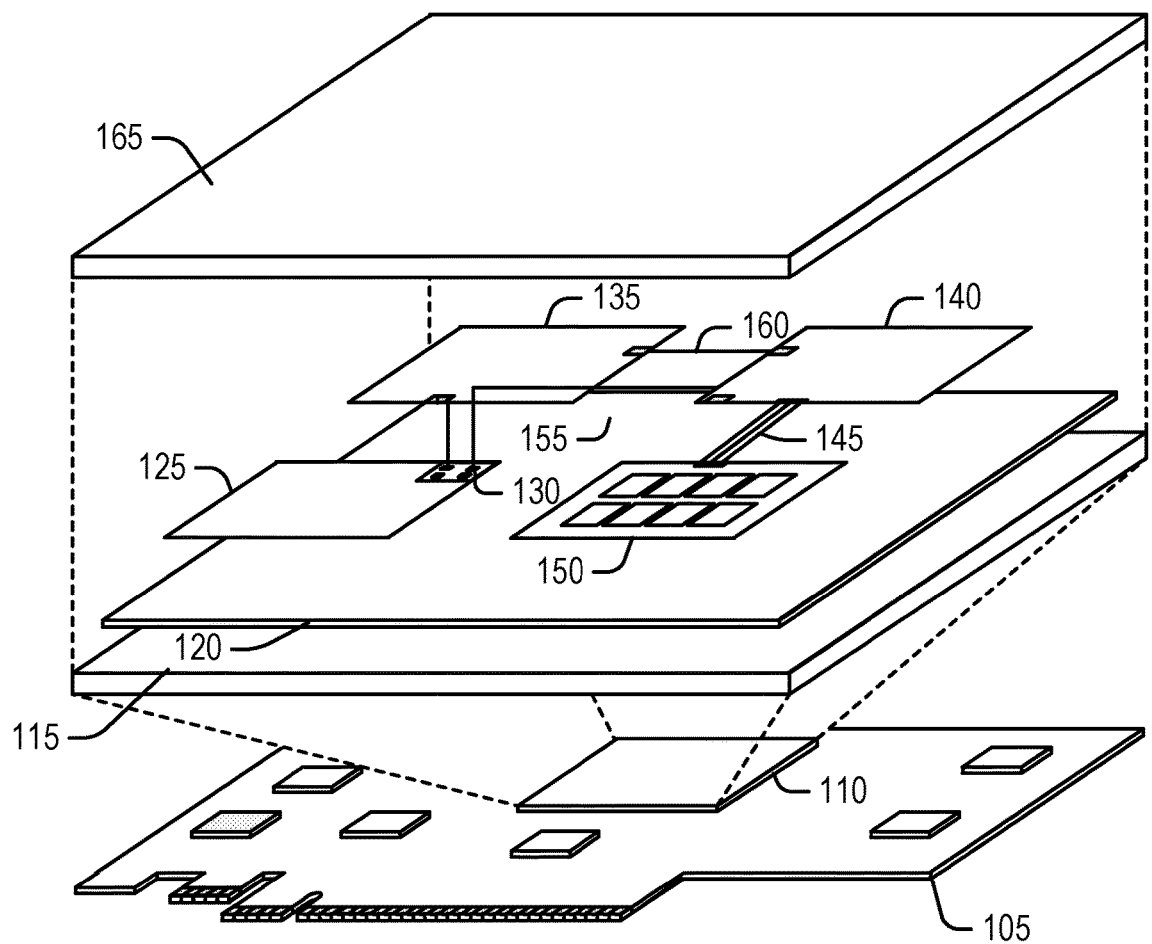
FIGS. 1A and 1B illustrate an example of a chiplet system, according to an embodiment.
Figure 1B:
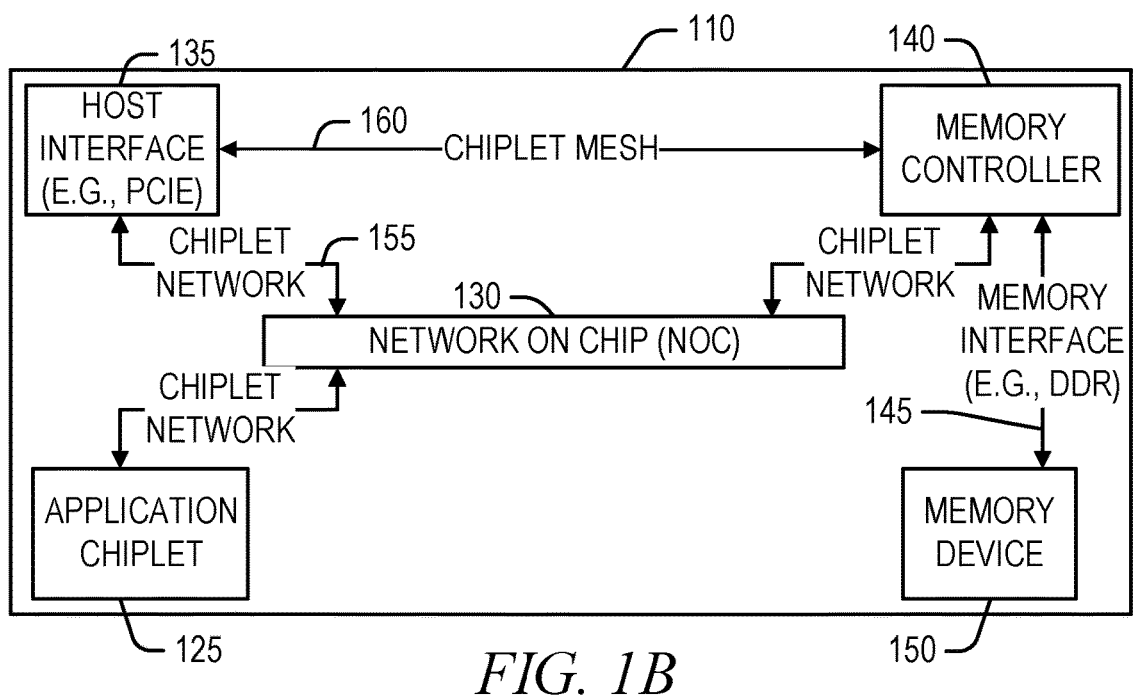

FIGS. 1A and 1B illustrate an example of a chiplet system 110, according to an embodiment. FIG. 1A is a representation of the chiplet system 110 mounted on a peripheral board 105, that can be connected to a broader computer system by a peripheral component interconnect express (PCIe), for example. The chiplet system 110 includes a package substrate 115, an interposer 120, and four chiplets: an application chiplet 125, a host interface chiplet 135, a memory controller chiplet 140, and a memory device chiplet 150. Other systems may include many additional chiplets to provide additional functionalities, as will be apparent from the following discussion. The package of the chiplet system 110 is illustrated with a lid or cover 165, though other packaging techniques and structures for the chiplet system can be used. FIG. 1B is a block diagram labeling the components in the chiplet system for clarity.

The application chiplet 125 is illustrated as including a network-on-chip (NOC) 130 to support a chiplet network 155 for inter-chiplet communications. In example embodiments, NOC 130 may be included on the application chiplet 125. In an example, NOC 130 may be defined in response to selected support chiplets (e.g., chiplets 135, 140, and 150), thus enabling a designer to select an appropriate number of chiplet network connections or switches for the NOC 130. In an example, the NOC 130 can be located on a separate chiplet or even within the interposer 120. In examples as discussed herein, the NOC 130 implements a CPI network.

The CPI is a packet-based network that supports virtual channels to enable a flexible and high-speed interaction between chiplets. CPI enables bridging from intra-chiplet networks to the chiplet network 155. For example, the Advanced eXtensible Interface (AXI) is a widely used specification to design intra-chip communications. AXI specifications, however, cover a great variety of physical design options, such as the number of physical channels, signal timing, power, and so forth. Within a single chip, these options are generally selected to meet design goals, such as power consumption, speed, and so forth. However, to achieve the flexibility of the chiplet system, an adapter, such as CPI, is used to interface between the various AXI design options that can be implemented in the various chiplets. By enabling a physical channel to virtual channel mapping and encapsulating time-based signaling with a packetized protocol, CPI bridges intra-chiplet networks across the chiplet network 155.

CPI can use a variety of different physical layers to transmit packets. The physical layer can include simple conductive connections or drivers to increase the voltage or otherwise facilitate transmitting the signals over longer distances. An example of one such physical layer can include the Advanced Interface Bus (AIB), which in various examples can be implemented in the interposer 120. AIB transmits and receives data using source synchronous data transfers with a forwarded clock. Packets are transferred across the AIB at single data rate (SDR) or dual data rate (DDR) with respect to the transmitted clock. Various channel widths are supported by AIB. AIB channel widths are in multiples of 20 bits when operated in SDR mode (20, 40, 60, . . . ), and multiples of 40 bits for DDR mode: (40, 80, 120, . . . ). The AIB channel width includes both transmit (TX) and receive (RX) signals. The channel can be configured to have a symmetrical number of TX and RX input/outputs (I/Os) or have a non-symmetrical number of transmitters and receivers (e.g., either all transmitters or all receivers). The channel can act as an AIB master or slave depending on which chiplet provides the master clock. AIB I/O cells support three clocking modes: asynchronous (i.e., non-clocked), SDR, and DDR. In various examples, the non-clocked mode is used for clocks and some control signals. The SDR mode can use dedicated SDR only I/O cells or dual use SDR/DDR I/O cells.

In an example, CPI packet protocols (e.g., point-to-point or routable) can use symmetrical receive and transmit I/O cells within an AIB channel. The CPI streaming protocol allows more flexible use of the AIB I/O cells. In an example, an AIB channel for streaming mode can configure the I/O cells as all TX, all RX, or half TX and half RX. CPI packet protocols can use an AIB channel in either SDR or DDR operation modes. In an example, the AIB channel is configured in increments of 80 I/O cells (i.e., 40 TX and 40 RX) for SDR mode and 40 I/O cells for DDR mode. The CPI streaming protocol can use an AIB channel in either SDR or DDR operation modes. Here, in an example, the AIB channel is in increments of 40 I/O cells for both SDR and DDR modes. In an example, each AIB channel is assigned a unique interface identifier. The identifier is used during CPI reset and initialization to determine paired AIB channels across adjacent chiplets. In an example, the interface identifier is a 20-bit value comprising a seven-bit chiplet identifier, a seven-bit column identifier, and a six-bit link identifier. The AIB physical layer transmits the interface identifier using an AIB out-of-band shift register. The 20-bit interface identifier is transferred in both directions across an AIB interface using bits 32-51 of the shift registers.

AIB defines a stacked set of AIB channels as an AIB channel column. An AIB channel column has some number of AIB channels, plus an auxiliary (AUX) channel. The AUX channel contains signals used for AIB initialization. All AIB channels (other than the AUX channel) within a column are of the same configuration (e.g., all TX, all RX, or half TX and half RX, as well as having the same number of data I/O signals). In an example, AIB channels are numbered in continuous increasing order starting with the MB channel adjacent to the AUX channel. The AIB channel adjacent to the AUX is defined to be AIB channel zero.

Generally, CPI interfaces on individual chiplets can include serialization-deserialization (SERDES) hardware. SERDES interconnects work well for scenarios in which high-speed signaling with low signal count are desirable. SERDES, however, can result in additional power consumption and longer latencies for multiplexing and demultiplexing, error detection or correction (e.g., using block level cyclic redundancy checking (CRC)), link-level retry, or forward error correction. However, when low latency or energy consumption is a primary concern for ultra-short reach chiplet-to-chiplet interconnects, a parallel interface with clock rates that allow data transfer with minimal latency may be utilized. CPI includes elements to minimize both latency and energy consumption in these ultra-short reach chiplet interconnects.

For flow control, CPI employs a credit-based technique. A recipient, such as the application chiplet 125, provides a sender, such as the memory controller chiplet 140, with credits that represent available buffers. In an example, a CPI recipient includes a buffer for each virtual channel for a given time-unit of transmission. Thus, if the CPI recipient supports five messages in time and a single virtual channel, the recipient has five buffers arranged in five rows (e.g., one row for each unit time). If four virtual channels are supported, then the recipient has twenty buffers arranged in five rows. Each buffer holds the payload of one CPI packet.

When the sender transmits to the recipient, the sender decrements the available credits based on the transmission. Once all credits for the recipient are consumed, the sender stops sending packets to the recipient. This ensures that the recipient always has an available buffer to store the transmission.

As the recipient processes received packets and frees buffers, the recipient communicates the available buffer space back to the sender. This credit return can then be used by the sender to allow transmitting of additional information.

Also illustrated is a chiplet mesh network 160 that uses a direct, chiplet-to-chiplet technique without the need for the NOC 130. The chiplet mesh network 160 can be implemented in CPI or another chiplet-to-chiplet protocol. The chiplet mesh network 160 generally enables a pipeline of chiplets where one chiplet serves as the interface to the pipeline while other chiplets in the pipeline interface only with themselves.

Additionally, dedicated device interfaces, such as one or more industry standard memory interfaces 145 (such as, for example, synchronous memory interfaces, such as DDR5, DDR 6), can also be used to interconnect chiplets. Connection of a chiplet system or individual chiplets to external devices (such as a larger system) can be through a desired interface (for example, a PCIE interface). Such an external interface may be implemented, in an example, through a host interface chiplet 135, which in the depicted example provides a PCIE interface external to chiplet system 110. Such dedicated interfaces 145 are generally employed when a convention or standard in the industry has converged on such an interface. The illustrated example of a DDR interface 145 connecting the memory controller chiplet 140 to a dynamic random access memory (DRAM) memory device chiplet 150 is just such an industry convention.

Of the variety of possible support chiplets, the memory controller chiplet 140 is likely present in the chiplet system 110 due to the near omnipresent use of storage for computer processing as well as being sophisticated state-of-the-art for memory devices. Thus, using memory device chiplets 150 and memory controller chiplets 140 produced by others gives chiplet system designers access to robust products by sophisticated producers. Generally, the memory controller chiplet 140 provides a memory device specific interface to read, write, or erase data. Often, the memory controller chiplet 140 can provide additional features, such as error detection, error correction, maintenance operations, or atomic operation execution. For some types of memory, maintenance operations tend to be specific to the memory device chiplet 150, such as garbage collection in negative-and (NAND) flash or storage class memories and temperature adjustments (e.g., cross temperature management) in NAND flash memories. In an example, the maintenance operations can include logical-to-physical (L2P) mapping or management to provide a level of indirection between the physical and logical representation of data. In other types of memory, for example DRAM, some memory operations, such as refresh, may be controlled by a host processor or a memory controller at some times, and at other times be controlled by the DRAM memory device or by logic associated with one or more DRAM devices, such as an interface chip (in an example, a buffer).

Atomic operations are a data manipulation that, for example, may be performed by the memory controller chiplet 140. In other chiplet systems, the atomic operations may be performed by other chiplets. For example, an atomic operation of "increment" can be specified in a command by the application chiplet 125, with the command including a memory address and possibly an increment value. Upon receiving the command, the memory controller chiplet 140 retrieves a number from the specified memory address, increments the number by the amount specified in the command, and stores the result. Upon a successful completion, the memory controller chiplet 140 provides an indication of the command's success to the application chiplet 125. Atomic operations avoid transmitting the data across the chiplet mesh network 160, resulting in lower latency execution of such commands.

Atomic operations can be classified as built-in atomics or programmable (e.g., custom) atomics. Built-in atomics are a finite set of operations that are immutably implemented in hardware. Programmable atomics are small programs that can run on a programmable atomic unit (PAU) (e.g., a custom atomic unit (CAU)) of the memory controller chiplet 140. FIG. 1 illustrates an example of a memory controller chiplet that comprises a PAU.

The memory device chiplet 150 can be, or include any combination of, volatile memory devices or non-volatile memories. Examples of volatile memory devices include, but are not limited to, random access memory ((RAM)—such as DRAM) synchronous DRAM (SDRAM), and graphics double data rate type 6 SDRAM (GDDR6 SDRAM), among others. Examples of non-volatile memory devices include, but are not limited to, NAND-type flash memory, storage class memory (e.g., phase-change memory or memristor based technologies), and ferroelectric RAM (Fe-RAM), among others. The illustrated example includes the memory device as the memory device chiplet 150; however, the memory device can reside elsewhere, such as in a different package on the board 105. For many applications, multiple memory device chiplets may be provided. In an example, these memory device chiplets may each implement one or multiple storage technologies. In an example, a memory chiplet may include multiple stacked memory die of different technologies (for example, one or more SRAM devices stacked or otherwise in communication with one or more DRAM devices). Memory controller chiplet 140 may also serve to coordinate operations between multiple memory chiplets in chiplet system 110 (for example, to utilize one or more memory chiplets in one or more levels of cache storage and to use one or more additional memory chiplets as main memory). Chiplet system 110 may also include multiple memory controller chiplets 140, as may be used to provide memory control functionality for separate processors, sensors, networks, and so forth. A chiplet architecture, such as chiplet system 110, offers advantages in allowing adaptation to different memory storage technologies and different memory interfaces, through updated chiplet configurations, without requiring redesign of the remainder of the system structure.

Figure 2:
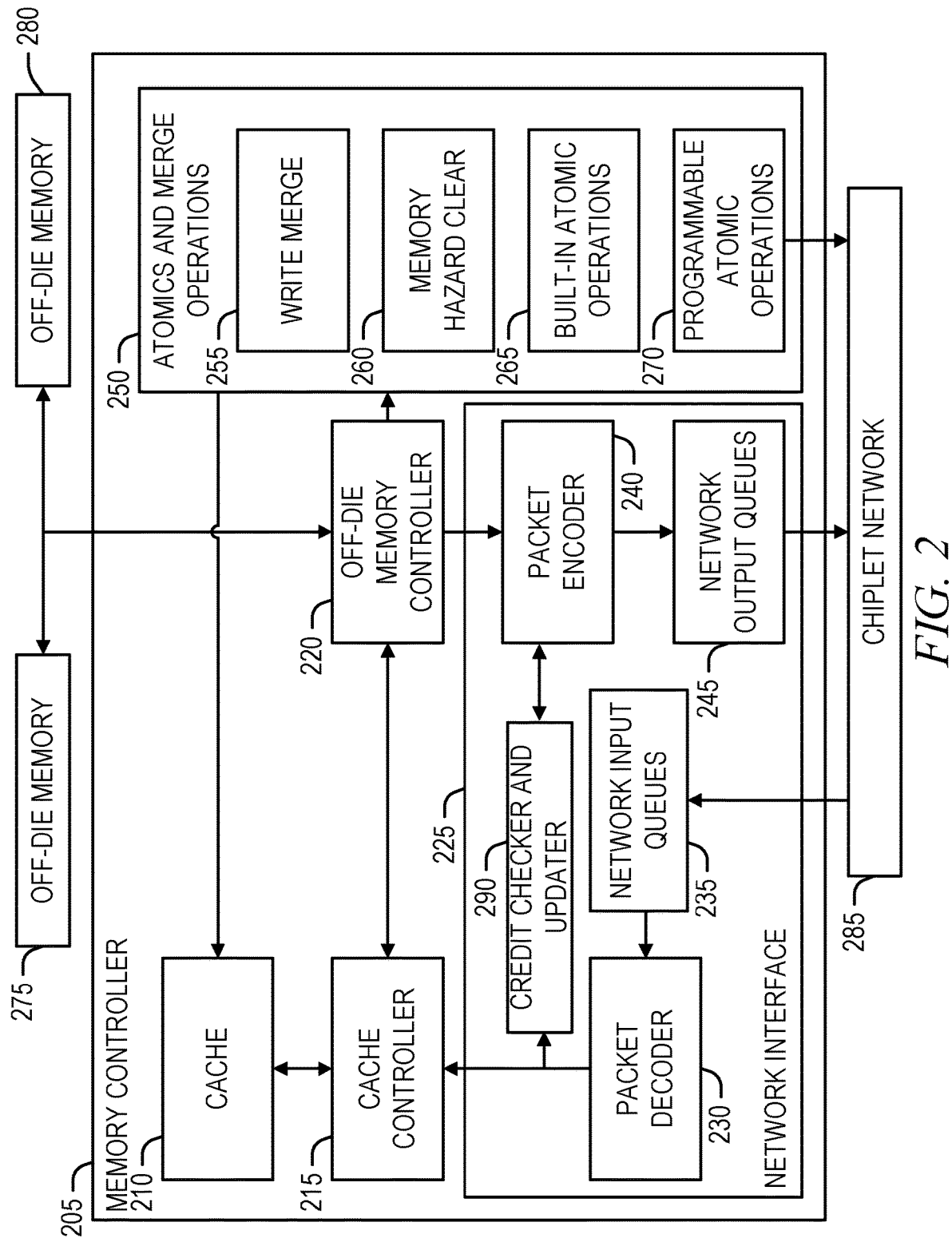
FIG. 2 illustrates components of an example of a memory controller chiplet, according to an embodiment.

FIG. 2 illustrates components of an example of a memory controller chiplet 205, according to an embodiment. The memory controller chiplet 205 includes a cache 210, a cache controller 215, an off-die memory controller 220 (e.g., to communicate with off-die memory 175), a network communication interface 225 (e.g., to interface with a chiplet network 180 and communicate with other chiplets), and a set of atomic and merge operations units 250. Members of this set can include, for example, a write merge unit 255, a hazard clear unit 260, built-in atomic unit 265, or a PAU 270. The various components are illustrated logically and not as they necessarily would be implemented. For example, the built-in atomic unit 265 likely comprises different devices along a path to the off-die memory. For example, the built-in atomic unit could be in an interface device/buffer on a memory chiplet, as discussed above. In contrast, the PAUs 270 are likely implemented in a separate processor on the memory controller chiplet 205 (but in various examples may be implemented in other locations, for example on a memory chiplet).

The off-die memory controller 220 is directly coupled to an off-die memory 275 (e.g., via a bus or other communication connection) to provide write operations and read operations to and from the one or more off-die memory, such as off-die memory 275 and off-die memory 280. In the depicted example, the off-die memory controller 220 is also coupled for output to the atomic and merge operations units 250 and for input to the cache controller 215 (e.g., a memory side cache controller).

In the example configuration, cache controller 215 is directly coupled to the cache 210 and may be coupled to the network communication interface 225 for input (such as incoming read or write requests) and coupled for output to the off-die memory controller 220.

The network communication interface 225 includes a packet decoder 230, network input queues 235, a packet encoder 240, network output queues 245, and a credit checker and updater 290 to support a packet-based chiplet network 285, such as CPI. The chiplet network 285 can provide packet routing between and among processors, memory controllers, hybrid threading processors, configurable processing circuits, or communication interfaces. In such a packet-based communication system, each packet typically includes destination and source addressing, along with any data payload or instruction. In an example, the chiplet network 285 can be implemented as a collection of crossbar switches having a folded Clos configuration or a mesh network providing for additional connections, depending upon the configuration.

The packet decoder 230 decodes incoming packets, converting them to internal memory instructions that are provided to the cache controller 215. Additionally, credit return data may be included in an incoming packet and provided to the credit checker and updater 290, to update the credits available (e.g., the credits available for a virtual channel of a source device of the incoming packet).

In various examples, the chiplet network 285 can be part of an asynchronous switching fabric. Here, a data packet can be routed along any of various paths, such that the arrival of any selected data packet at an addressed destination can occur at any of multiple different times, depending upon the routing. Additionally, chiplet network 285 can be implemented at least in part as a synchronous communication network, such as a synchronous mesh communication network. Both configurations of communication networks are contemplated for use for examples in accordance with the present disclosure.

The memory controller chiplet 205 can receive a packet having, for example, a source address, a read request, and a physical address. In response, the off-die memory controller 220 or the cache controller 215 will read the data from the specified physical address (which can be in the off-die memory 275 or in the cache 210) and assemble a response packet to the source address containing the requested data. Similarly, the memory controller chiplet 205 can receive a packet having a source address, a write request, and a physical address. In response, the memory controller chiplet 205 will write the data to the specified physical address (which can be in the cache 210 or in the off-die memories 275 or 280) and assemble a response packet to the source address containing an acknowledgement that the data was stored to a memory.

Thus, the memory controller chiplet 205 can receive read and write requests via the chiplet network 285 and process the requests using the cache controller 215 interfacing with the cache 210, if possible. If the request cannot be handled by the cache controller 215, the off-die memory controller 220 handles the request by communication with the off-die memories 275 or 280, the atomic and merge operations units 250, or both. As noted above, one or more levels of cache may also be implemented in off-die memories 275 or 280, and in some such examples may be accessed directly by cache controller 215. Data read by the off-die memory controller 220 can be cached in the cache 210 by the cache controller 215 for later use.

The atomic and merge operations units 250 are coupled to receive (as input) the output of the off-die memory controller 220, and to provide output to the cache 210, the network communication interface 225, or directly to the chiplet network 285. The memory hazard clear (reset) unit 260, write merge unit 255, and the built-in (e.g., predetermined) atomic operations unit 265 can each be implemented as state machines with other combinational logic circuitry (such as adders, shifters, comparators, AND gates, OR gates, XOR gates, or any suitable combination thereof) or other logic circuitry. These components can also include one or more registers or buffers to store operand or other data. The PAU 270 can be implemented as one or more processor cores or control circuitry and various state machines with other combinational logic circuitry or other logic circuitry, and can also include one or more registers, buffers, or memories to store addresses, executable instructions, operand and other data, or can be implemented as a processor.

The write merge unit 255 receives read data and request data and merges the request data and read data to create a single unit having the read data and the source address to be used in the response or return data packet. The write merge unit 255 provides the merged data to the write port of the cache 210 (or, equivalently, to the cache controller 215 to write to the cache 210). Optionally, the write merge unit 255 provides the merged data to the network communication interface 225 to encode and prepare a response or return data packet for transmission on the chiplet network 285.

When the request data is for a built-in atomic operation, the built-in atomic operations unit 265 receives the request and reads data, either from the write merge unit 255 or directly from the off-die memory controller 220. The atomic operation is performed, and using the write merge unit 255, the resulting data is written to the cache 210, or provided to the network communication interface 225 to encode and prepare a response or return data packet for transmission on the chiplet network 285.

The built-in atomic operations unit 265 handles predefined atomic operations such as fetch-and-increment or compare-and-swap. In an example, these operations perform a simple read-modify-write operation to a single memory location of 32-bytes or less in size. Atomic memory operations are initiated from a request packet transmitted over the chiplet network 285. The request packet has a physical address, atomic operator type, operand size, and, optionally, up to 32-bytes of data. The atomic operation performs the read-modify-write to a cache memory line of the cache 210, filling the cache memory if necessary. The atomic operator response can be a simple completion response or a response with up to 32-bytes of data. Example atomic memory operators include fetch-and-AND, fetch-and-OR, fetch-and- XOR, fetch-and-add, fetch-and-subtract, fetch-and-increment, fetch-and-decrement, fetch-and-minimum, fetch-and-maximum, fetch-and-swap, and compare-and-swap. In various example embodiments, 32-bit and 64-bit operations are supported, along with operations on 16 or 32 bytes of data. Methods disclosed herein are also compatible with hardware supporting larger or smaller operations and more or less data.

Built-in atomic operations can also involve requests for a "standard" atomic operation on the requested data, such as comparatively simple, single cycle, integer atomics, such as fetch-and-increment or compare-and-swap, which will occur with the same throughput as a regular memory read or write operation not involving an atomic operation. For these operations, the cache controller 215 may generally reserve a cache line in the cache 210 by setting a hazard bit (in hardware), so that the cache line cannot be read by another process while it is in transition. The data is obtained from either the off-die memory 275 or the cache 210, and is provided to the built-in atomic operation unit 265 to perform the requested atomic operation. Following the atomic operation, in addition to providing the resulting data to the data packet encoder 240 to encode outgoing data packets for transmission on the chiplet network 285, the built-in atomic operation unit 265 provides the resulting data to the write merge unit 255, which will also write the resulting data to the cache 210. Following the writing of the resulting data to the cache 210, any corresponding hazard bit which was set will be cleared by the memory hazard clear unit 260.

Prior to transmitting a packet to the chiplet network 285, the packet encoder 240 or the network output queues 245 may verify with the credit checker and updater 290 that sufficient credits are available for the transmission. For example, a packet for virtual channel 0 of a destination device that costs six credits (e.g., because it contains six flits or will transferred in six transfer cycles) may be sent only if at least six credits are available for virtual channel 0 of the destination device. If the packet is sent, the available credits are reduced by six. The available credits may be increased upon receipt of a credit return packet (or another packet including credit return data) from the destination device. Thus, by use of credits, the sending and receiving device are able to communicate without overflowing receive buffers at the receiving device.

The PAU 270 enables high performance (high throughput and low latency) for programmable atomic operations (also referred to as "custom atomic operations"), comparable to the performance of built-in atomic operations. Rather than executing multiple memory accesses, in response to an atomic operation request designating a programmable atomic operation and a memory address, circuitry in the memory controller chiplet 205 transfers the atomic operation request to PAU 270 and sets a hazard bit stored in a memory hazard register corresponding to the memory address of the memory line used in the atomic operation to ensure that no other operation (read, write, or atomic) is performed on that memory line, and that hazard bit is then cleared upon completion of the atomic operation. Additional direct data paths provided for the PAU 270 executing the programmable atomic operations allow for additional write operations without any limitations imposed by the bandwidth of the communication networks and without increasing any congestion of the communication networks.

The PAU 270 includes a multi-threaded processor, for example, such as a RISC-V ISA based multi-threaded processor, having one or more processor cores, and further having an extended instruction set for executing programmable atomic operations. When provided with the extended instruction set for executing programmable atomic operations, the PAU 270 can be embodied as one or more hybrid threading processors. In some example embodiments, the PAU 270 provides barrel-style, round-robin instantaneous thread switching to maintain a high instruction-per-clock rate.

Programmable atomic operations can be performed by the PAU 270 involving requests for a programmable atomic operation on the requested data. A user can prepare programming code to provide such programmable atomic operations. For example, the programmable atomic operations can be comparatively simple, multi-cycle operations such as floating-point addition, or comparatively complex, multi-instruction operations such as a Bloom filter insert. The programmable atomic operations can be the same as or different than the predetermined atomic operations, insofar as they are defined by the user rather than a system vendor. For these operations, the cache controller 215 can reserve a cache line in the cache 210, by setting a hazard bit (in hardware), so that cache line cannot be read by another process while it is in transition. The data is obtained from either the cache 210 or the off-die memories 275 or 280, and is provided to the PAU 270 to perform the requested programmable atomic operation. Following the atomic operation, the PAU 270 will provide the resulting data to the network communication interface 225 to directly encode outgoing data packets having the resulting data for transmission on the chiplet network 285. In addition, the PAU 270 will provide the resulting data to the cache controller 215, which will also write the resulting data to the cache 210. Following the writing of the resulting data to the cache 210, any corresponding hazard bit which was set will be cleared by the cache controller 215.

In selected examples, the approach taken for programmable atomic operations is to provide multiple custom atomic request types that can be sent through the chiplet network 285 to the memory controller chiplet 205 from an originating source such as a processor or other system component. The cache controllers 215 or off-die memory controller 220 identify the request as a custom atomic and forward the request to the PAU 270. In a representative embodiment, the PAU 270: (1) is a programmable processing element capable of efficiently performing a user defined atomic operation; (2) can perform load and stores to memory, arithmetic and logical operations, and control flow decisions; and (3) leverages the RISC-V ISA with a set of new, specialized instructions to facilitate interacting with such controllers 215, 220 to atomically perform the user-defined operation. In desirable examples, the RISC-V ISA contains a full set of instructions that support high level language operators and data types. The PAU 270 can leverage the RISC-V ISA, but will commonly support a more limited set of instructions and limited register file size to reduce the die size of the unit when included within the memory controller chiplet 205.

As mentioned above, prior to the writing of the read data to the cache 210, the set hazard bit for the reserved cache line is to be cleared by the memory hazard clear unit 260. Accordingly, when the request and read data is received by the write merge unit 255, a reset or clear signal can be transmitted by the memory hazard clear unit 260 to the cache 210 to reset the set memory hazard bit for the reserved cache line. Also, resetting this hazard bit will release a pending read or write request involving the designated (or reserved) cache line, providing the pending read or write request to an inbound request multiplexer for selection and processing.

Figure 3:
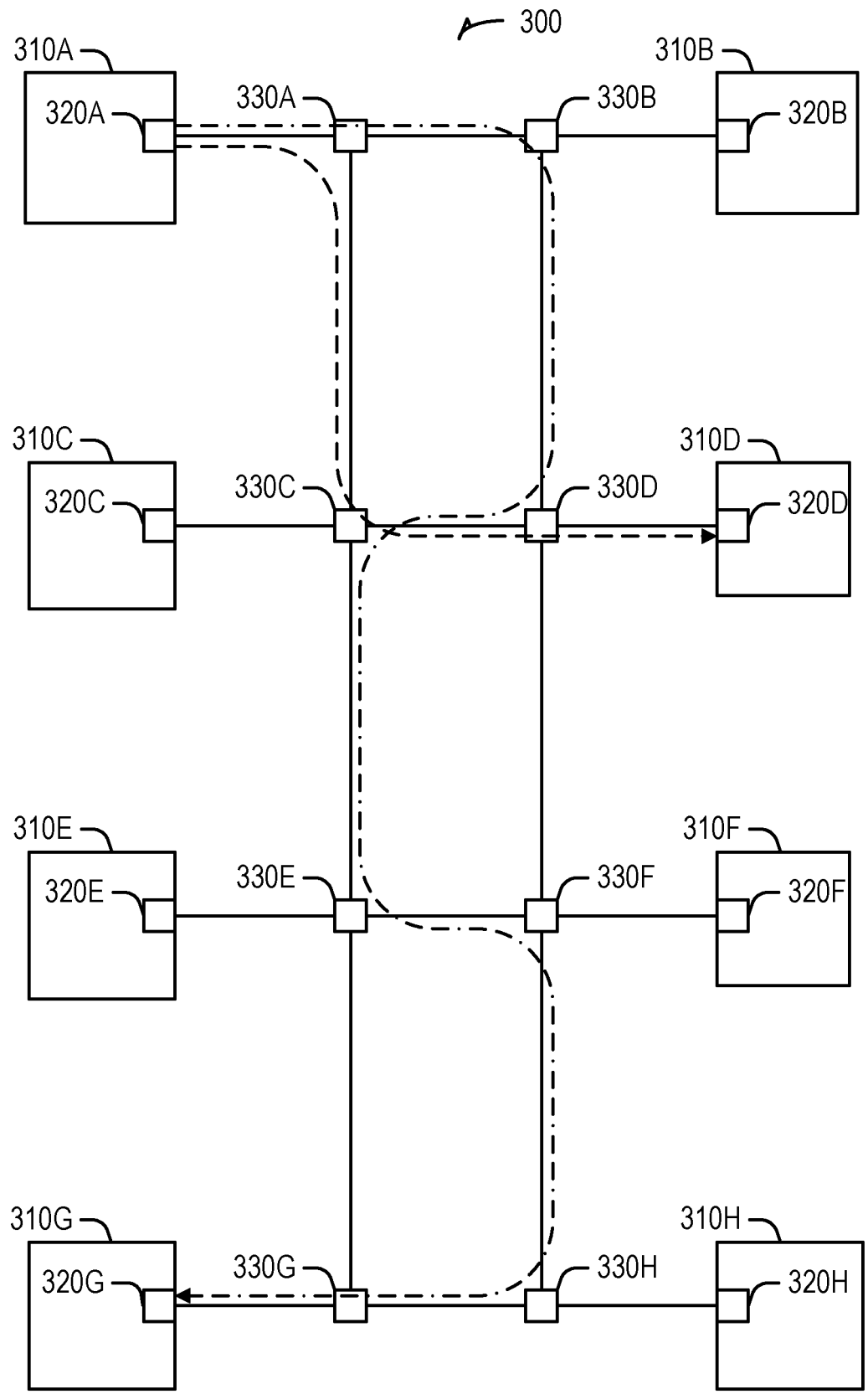
FIG. 3 illustrates an example of routing between chiplets using a chiplet protocol interface (CPI) network, according to an embodiment.

FIG. 3 illustrates an example of routing between chiplets in a chiplet layout 300 using a CPI network, according to an embodiment. The chiplet layout 300 includes chiplets 310A, 310B, 310C, 310D, 310E, 310F, 310G, and 310H. The chiplets 310A-310H are interconnected by a network comprising nodes 330A, 330B, 330C, 330D, 330E, 330F, 330G, and 330H. Each of the chiplets 310A-310H includes a hardware transceiver, labeled 320A-320H.

CPI packets can be transferred between the chiplets 310 using an AIB. The AIB provides physical layer functionality. The physical layer transmits and receives data using source synchronous data transfers with a forwarded clock. Packets are transferred across the AIB at SDR or DDR with respect to the transmitted clock. Various channel widths are supported by the AIB. AIB channel widths are in multiples of 20 bits when operated in SDR mode (20, 40, 60, . . . ), and 40 bits for DDR mode (40, 80, 120, . . . ). The AIB channel width includes both TX and RX signals. The channel may be configured to have a symmetrical number of TX and RX I/Os or have a non-symmetrical number of transmitters and receivers (e.g., either all transmitters or all receivers). The channel may act as an AIB master or slave depending on which chiplet provides the master clock.

The AIB adapter provides an interface to the AIB link layer and an interface to the AIB physical layer (PHY). The AIB adapter provides data staging registers, power-on reset sequencers, and a control signal shift register.

The AIB physical layer consists of AIB I/O Cells. AIB I/O cells (implemented, in some example embodiments, by the hardware transceivers 320) may be input only, output only, or bidirectional. An AIB channel is composed of a set of AIB I/O cells, and the number of cells is dependent on the configuration of the AIB channel. The receive signals on one chiplet are connected to the transmit signals on the paired chiplet. In some example embodiments, each column comprises an AUX channel and data channels numbered 0 to N.

AIB channels are typically configured as half TX data plus half RX data; all TX data; or all RX data plus associated clocks and miscellaneous control. The number of TX versus RX data signals is determined at design time and cannot be configured as part of system initialization, in some example embodiments.

The CPI packet protocols (point-to-point and routable) use symmetrical receive and transmit I/O cells within an AIB channel. The CPI streaming protocol allows more flexible use of the AIB I/O cells. An AIB channel for streaming mode may configure the I/O cells as all TX, all RX, or half TX and half RX, in some example embodiments.

Data packets are routed among the chiplets 310 by the network nodes 330. A node 330 may determine the next node 330 to forward a received data packet to based on one or more data fields of the data packet. For example, a source or destination address, source or destination port, virtual channel, or any suitable combination thereof may be hashed to select a successive network node or an available network path. Selecting paths in this way may serve to balance network traffic.

Thus, in FIG. 3, a data path is shown from the chiplet 310A to the chiplet 310D. The data packet is sent by the hardware transceiver 320A to the network node 330A; forwarded by the network node 330A to the network node 330C; forwarded by the network node 330C to the network node 330D; and delivered by the network node 330D to the hardware transceiver 320D of the chiplet 310D.

A second data path is also shown in FIG. 3, from the chiplet 310A to the chiplet 310G. The data packet is sent by the hardware transceiver 320A to the network node 330A; forwarded by the network node 330A to the network node 330B; forwarded by the network node 330B to the network node 330D; forwarded by the network node 330D to the network node 330C; forwarded by the network node 330C to the network node 330E; forwarded by the network node 330E to the network node 330F; forwarded by the network node 330F to the network node 330H; forwarded by the network node 330H to the network node 330G; and delivered by the network node 330G to the hardware transceiver 320G of the chiplet 310G. As is visually apparent in FIG. 3, multiple paths through the network are available for transmission of data between any pair of chiplets.

AIB I/O cells support three clocking modes: asynchronous (i.e., non-clocked), SDR, and DDR. The non-clocked mode is used for clocks and some control signals. The SDR mode may use dedicated SDR only I/O cells or dual use SDR/DDR I/O cells.

CPI packet protocols (point-to-point and routable) may use an AIB channel in either SDR or DDR operation modes. In some example embodiments, the AIB channel is in increments of 80 I/O cells (i.e. 40 TX and 40 RX) for SDR mode and 40 I/O cells for DDR mode.

CPI streaming protocol may use an AIB channel in either SDR or DDR operation modes. In some example embodiments, for both modes (SDR and DDR), the AIB channel is in increments of 40 I/O cells.

Each AIB channel is assigned a unique interface identifier. The identifier is used during CPI reset and initialization to determine paired AIB channels across adjacent chiplets. In some example embodiments, the interface identifier is a 20-bit value comprising a seven-bit chiplet identifier, a seven-bit column identifier, and a six-bit link identifier. The AIB physical layer transmits the interface identifier using an AIB out-of-band shift register. The 20-bit interface identifier is transferred in both directions across an AIB interface using bits 32-51 of the shift registers.

In some example embodiments, AIB channels are numbered in continuous increasing order starting with the AIB channel adjacent to the AUX channel. The AIB channel adjacent to the AUX is defined to be AIB channel zero.

FIG. 3, by way of example, shows eight chiplets 310 connected by a network comprising eight nodes 330. More or fewer chiplets 310 and more or fewer nodes 330 may be included in the chiplet network, allowing a network of chiplets of arbitrary size to be created.

Figure 4:
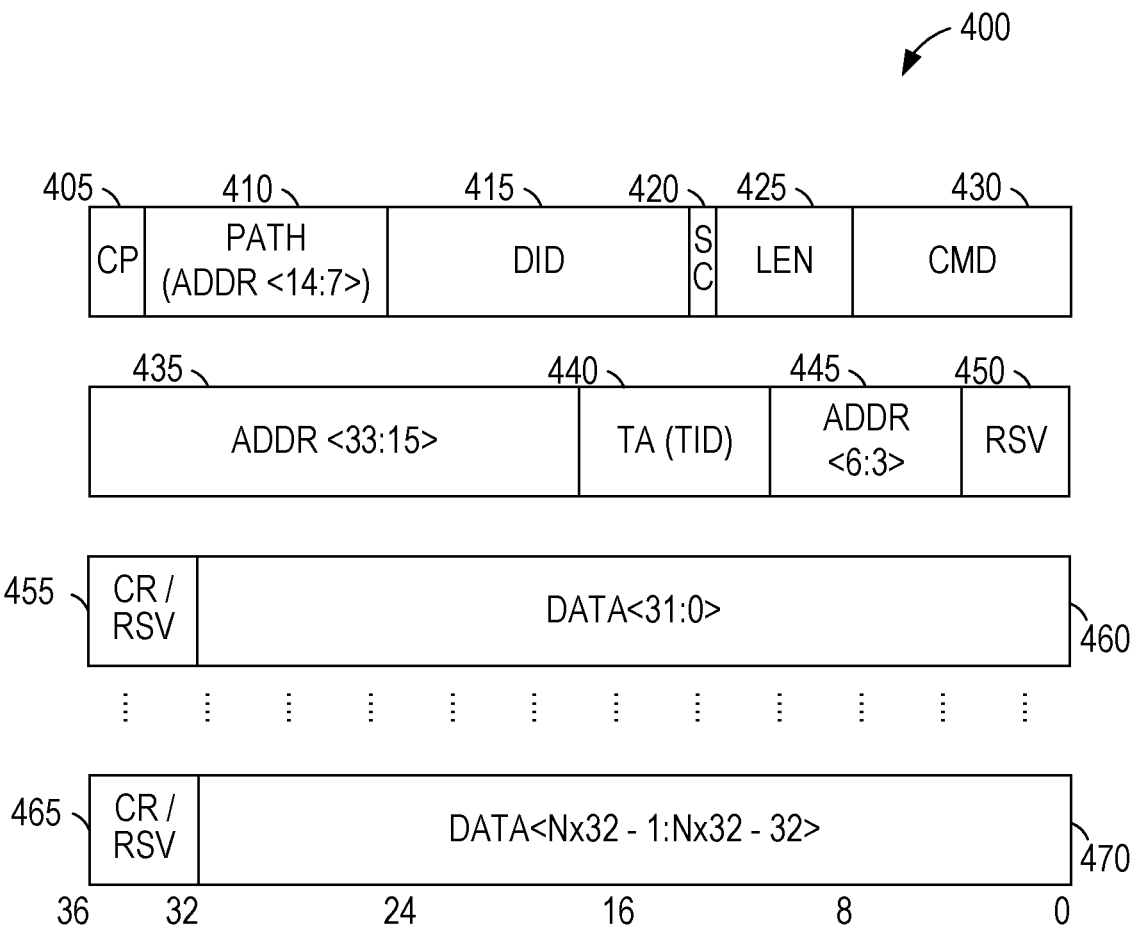
FIG. 4 is a block diagram of a data packet comprising multiple flits, in accordance with some embodiments of the present disclosure.

FIG. 4 is a block diagram of a data packet 400 comprising multiple flits, in accordance with some embodiments of the present disclosure. The data packet 400 is divided into flow control units (flits), each of which is composed of 36 bits. The first flit of the data packet 400 includes control path field 405, path field 410, destination identifier (DID) field 415, sequence continue (SC) field 420, length field 425, and command field 430. The second flit includes address fields 435 and 445, a transaction id (TID) field 440, and reserved (RSV) field 450. Each remaining flit includes a credit return (CR)/RSV field (e.g., the CR/RSV fields 455 and 465) and a data field (e.g., the data fields 460 and 470).

The control path field 405 is a two-bit field that indicates whether the CR/RSV field of later flits in the packet contain CR data, RSV data, or should be ignored, and whether the path field 410 should be used to control ordering of packets. In some example embodiments, a value of 0 or 1 in the control path field 405 indicates that the CR/RSV fields 455, 465 contain credit return data; a value of 2 or 3 in the control path field 405 indicates that the CR/RSV fields 455, 465 contain RSV data; a value of 0 indicates that the path field 410 is ignored; a value of 1 or 3 indicates that the path field 410 is used to determine the path for the data packet 400; and a value of 2 indicates that single path ordering is to be used. In some example embodiments a 1-bit field is used. Alternatively, the high bit of the control path field 405 may be considered to be a 1-bit field that controls whether the CR/RSV fields 455, 465 contain credit return data or RSV data.

The path field 410 is an eight-bit field. When the control path field 405 indicates that the path field 410 is used to determine the path for a data packet 400, all data packets having the same value for the path field 410 are guaranteed to take the same path through the network. As a result, the order of the data packets will be unchanged between the sender and the receiver. If the control path field 405 indicates that single path ordering is to be used, the path is determined for each packet as though the path field 410 were set to zero. Accordingly, all packets take the same path and the order will be unchanged, regardless of the actual value of the path field 410 of each data packet. If the control path field 405 indicates that the path field 410 is to be ignored, the data packets are routed without regard to the value of the path field 410 and the data packets may be received by the receiver in a different order than they were sent by the sender. However, this may avoid congestion in the network and allow for greater throughput in the device.

The DID field 415 stores a twelve-bit DID. The DID uniquely identifies a destination in the network (e.g., a destination chiplet). A sequence of data packets all having the SC field 420 set are guaranteed to be delivered in order. The length field 425 is a five-bit field that indicates the number of flits that comprise the data packet 400. Interpretation of the length field 425 may be non-linear. For example, values 0-22 may be interpreted as 0-22 flits in the data packet 400 and values 23-27 may be interpreted as 33-37 flits in the data packet 400 (i.e., 10 more than the indicated value). Other values of the length field 425 may be vendor defined instead of protocol defined.

The command for the data packet 400 is stored in the command field 430, a seven-bit field. The command may be a write command, a read command, a predefined atomic operation command, a custom atomic operation command, a read response, an acknowledge response, or a vendor-specific command. Additionally, the command may indicate a virtual channel of the data packet 400. For example, different commands may be used for different virtual channels or 1, 2, 3, or 4 bits of the seven-bit command field 430 may be used to indicate the virtual channel and the remaining bits may be used to indicate the command. The table below shows the virtual channel based on the protocol and the command is below, according to some example embodiments.

| Virtual Channel | CPI Protocol | AXI Protocol |
|---|---|---|
| 0 | Read/Write Requests | Write Requests |
| 1 | Read/Write Responses | Write Responses |
| 2 | Unused | Read Requests |
| 3 | Unused | Read Responses |
| 4 | Priority Read/Write Requests | Priority Write Requests |
| 5 | Priority Read/Write Responses | Priority Write Responses |
| 6 | Unused | Priority Read Requests |
| 7 | Unused | Priority Read Responses |

An address for the command may be indicated in the path field 410, the address fields 435 and 445, or any suitable combination thereof. For example, the high 31 bits of an 8-byte aligned 34-bit address may be indicated by concatenating the address field 435, the path field 410, and the address field 445 in order (high bits first). The TID field 440 is used to match responses to requests. For example, if a first packet 400 is a read request that identifies a memory location to read, a responsive second packet 400 containing the read data will include the same value in the TID field 440.

The memory access commands may identify a number of bytes to be written or accessed, a memory space to access (e.g., the off-die memory 275 or an instruction memory for custom atomic operations), or any suitable combination thereof. In some example embodiments, the command may indicate that additional bits of a later flit identify the command. For example, a multi-byte command could be sent by using a vendor-specific command in the seven-bit command field 430 and using a portion or all of the data field 460 to store the multi-byte command. Thus, for certain values of the command field 430, the packet 400 includes only one header flit (e.g., the first header flit shown in FIG. 4, containing fields 405-430). For other values of the command field 430, the packet 400 includes a predetermined additional number of header flits or a predetermined total number of header flits.

If CR is enabled, two bits of the CR/RSV field 455, 465 identify whether the credit return is for virtual channel 0, 1, 2, or 3 and the other two bits of the CR/RSV field 455, 465 indicate whether the number of credits to be returned is 0, 1, 2, or 3.

Figure 5:
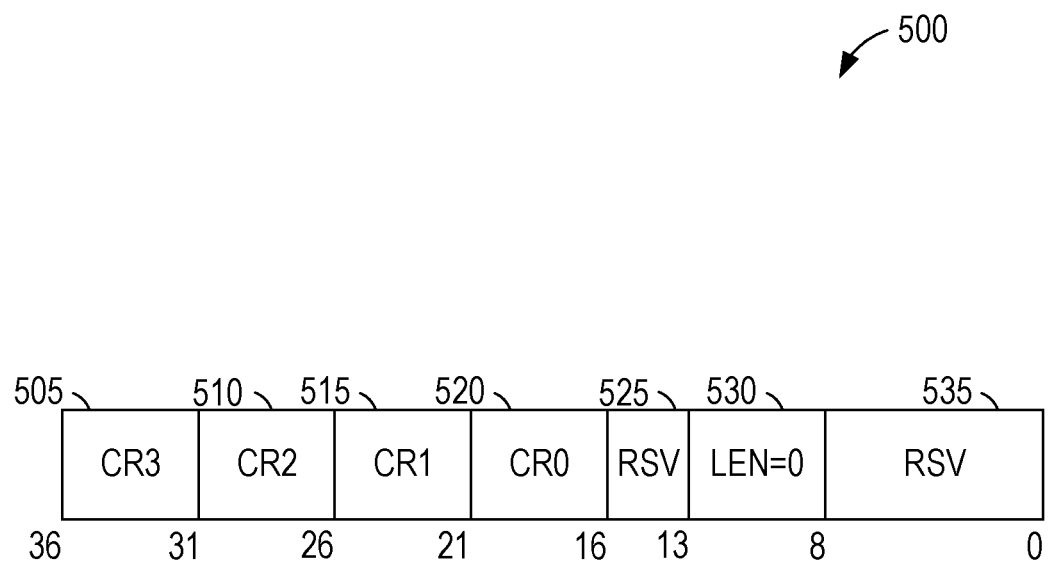
FIG. 5 is a block diagram of a credit return data packet, in accordance with some embodiments of the present disclosure.

FIG. 5 is a block diagram of a credit return data packet 500, in accordance with some embodiments of the present disclosure. The data packet 500 comprises a single 36-bit flit. The flit includes four credit return fields 505, 510, 515, and 520, a length field 530, and reserved fields 525 and 535. The length field 530 is set to zero, to indicate that no additional flits make up the data packet 500. The reserved fields 525 and 535 are not used and should be set to zero.

Each of the credit return fields 505-520 is a five-bit field. The first bit of a credit return field 505-520 is set to zero if the credits are being returned to a low virtual channel. The first bit of a credit return field 505-520 is set to one if the credits are being returned to a high virtual channel. The remaining four bits of each credit return field 505-520 indicate the number of credits (0-15) being returned. Thus, the CR0 credit return field 520 returns 0-15 credits to virtual channel 0 or 4; the CR1 credit return field 515 returns 0-15 credits to virtual channel 1 or 5; the CR2 credit return field 510 returns 0-15 credits to virtual channel 2 or 6; and the CR3 credit return field 505 returns 0-15 credits to virtual channel 3 or 7.

Thus, early credit return for credit-based flow control can be implemented by using the CR/RSV field 455, 465 of the data packet 400 when sending other data packets, such as acknowledgement packets or by using the data packet 500.

Based on the size of the packet and the number of available credits for the destination, the source determines whether sufficient credits are available to transfer the entire packet. In a flit-based flow control credit scheme, the number of credits used to transfer the packet is the number of flits in the packet. In a transfer cycle-based flow control scheme, the number of credits used to transfer the packet is the number of transfer cycles used to transfer the packet. This may be determined by using the equation below:

$$\text{cycles} = \text{ceiling}\left(\frac{f_0 + \text{size}}{\text{width}}\right)$$

In this equation, cycles is the number of transfer cycles it will take to transfer the packet, ceiling is a function that rounds fractional values up to the next integer, $f_O$ is the 0-based offset of the position of the first flit in the wide bus, and width is the width of the bus, measured in flits. Thus, when width=1, $f_O$ is always 0, and the number of cycles is simply the size of the packet in flits. When width=2 and $f_O$ is 0, the number of cycles is half the size of the packet, rounded up. When width=2 and $f_O$ is 1, a packet with an even number of flits takes an additional transfer cycle to transmit (due to transmitting only one flit on the first transfer cycle and one flit on the last transfer cycle).

Figure 6:
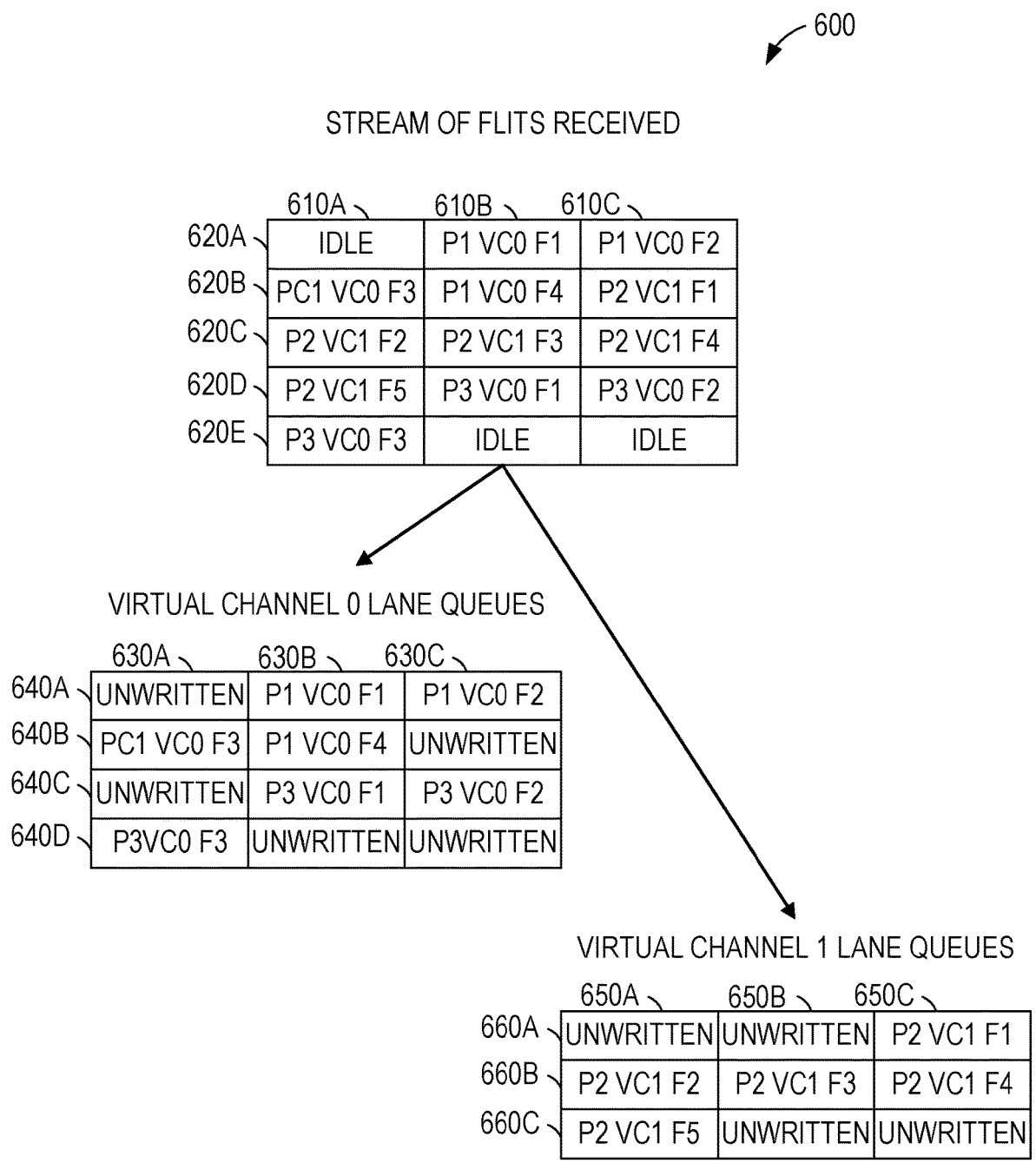
FIG. 6 is a block diagram showing a stream of flits received and virtual channel queues of the received flits, in accordance with some embodiments of the present disclosure.

FIG. 6 is a block diagram 600 showing a stream of flits received and virtual channel queues of the received flits, in accordance with some embodiments of the present disclosure. The interface on which the stream of flits is received is three lanes wide. Thus, one flit is received simultaneously (or at least contemporaneously) on each of lanes 610A, 610B, and 610C. The received flits are shown sequentially in rows 620A, 620B, 620C, 620D, and 620E. After receipt, the flits are stored in either the virtual channel 0 lane queues 630A, 630B, and 630C or the virtual channel 1 lane queues 650A, 650B, and 650C. The virtual channel 0 lane queues 630A-630C store flits in rows 640A, 640B, 640C, and 640D. The virtual channel 1 lane queues 650A-650C store flits in rows 660A, 660B, and 660C. Each lane 610A-610C physically receives data over a portion of a wide bus. The virtual channels are not physical and do not directly correspond to the lanes 610A-610C. For example, packets destined for virtual channel 0 may be write packets entered into a write queue for handling. The write packets may span multiple physical channels and begin and end on any physical lane.

The stream of flits received shows three packets: P1, P2, and P3. P1 is destined for virtual channel 0 and comprises four flits. P2 is destined for virtual channel 1 and comprises five flits. P3 is destined for virtual channel 0 and comprises 3 flits. The virtual channel for each packet may be determined based on the destination identifier 415 in the header.

On each clock cycle, the entire row of received data (e.g., one of the rows 620A-620E) is wholly or partially copied to zero or more of the virtual channel lane queues based on the destination of the flits in the row. For example, the row 620A is partially copied to the row 640A because the two flits in the row 620A are destined for virtual channel 0. The data in the idle flit of the row 620A may be copied or left unwritten in the row 640A. As another example, the row 620B is partially copied to both the row 640B and the row 660A because the row 620B contains at least one flit for both the virtual channel 0 and the virtual channel 1.

A credit represents a single entry in each of the three lane queues for a specific virtual channel. This allows a single read and write queue pointer to be used across the three lane queues per virtual channel. The side effect of this queuing organization is that if any flits are written to the set of lane queues associated with a virtual channel, then an entry in each of the three lane queues is considered written for that virtual channel (e.g., a single write pointer is used across the three lane queues for a virtual channel). Packets of the same virtual channel, written to the set of associated virtual channel lane queues, may have one or more idle flits between the packets within the queues. The number of idle entries depends on the ending and starting lane positions of the two packets.

By copying the entire row into a queue with multiple lanes instead of copying each flit individually into a single-lane queue, the timing of the circuit design is easier to meet. For example, with respect to the row 620A, the first flit of P1 would be copied into a first entry of a single-lane queue, a destination pointer would be incremented, and then the second flit of P1 would be copied into a second entry of the single-lane queue. Each of these operations would need to complete before the next clock cycle of the bus on which the stream of flits is being received, using a higher internal clock rate.

Figure 7:
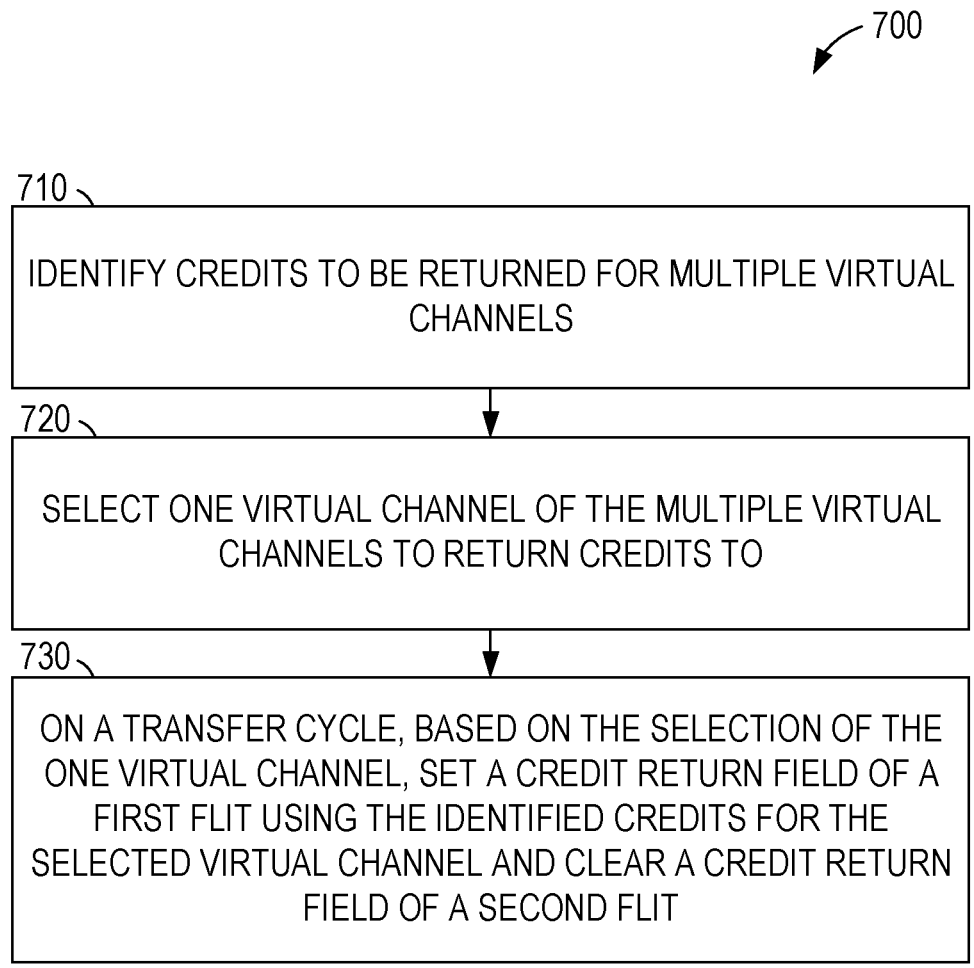
FIG. 7 is a flow chart showing operations of a method performed by a circuit in updating credit data, in accordance with some embodiments of the present disclosure.

FIG. 7 is a flow chart showing operations of a method 700 performed by a circuit in updating credit data, in accordance with some embodiments of the present disclosure. The method 700 includes operations 710, 720, and 730. By way of example and not limitation, the method 700 is described as being performed by the devices of FIGS. 1-3, using the data packet of FIG. 4.

In operation 710, a transmitting device (e.g., the chiplet 310A of FIG. 3, implementing or communicating with the memory controller chiplet 205 of FIG. 2) identifies credits to be returned for multiple virtual channels. For example, credits may be ready to be returned to the chiplet 310D of FIG. 3 for virtual channels 0, 1, and 2.

The transmitting device, in operation 720, selects one virtual channel of the multiple virtual channels to return credits to. For example, the virtual channel having the most credits to be returned may be selected, the next virtual channel in a circular queue may be selected (e.g., so that virtual channel 0 is selected first, followed by virtual channel 1, then virtual channel 2, then virtual channel 3, and so on until all virtual channels have been selected and virtual channel 0 is selected again), or another selection algorithm may be used.

In operation 730, on a transfer cycle, based on the selection of the one virtual channel, the transmitting device sets a credit return field of a first flit using the identified credits for the selected virtual channel and clears a credit return field of a second flit. For example, using a wide bus that transmits two flits per transfer cycle, the CR/RSV field 455 of a first flit is set to indicate the returned credits on the selected virtual channel and the CR/RSV 465 of a second flit transmitted on the same transfer cycle is cleared to indicate no returned credits.

Operations of the method 700 may be performed by the credit checker and updater 290 of the transmitting device. By use of the method 700 in a transmitting device coupled to a network that increases packet throughput by using a wide bus that transfers multiple flits per transfer cycle, no modification is made to the format of the flits, but the transmitting device ensures that only one flit returns credits per transfer cycle. Thus, by comparison with systems using a single-flit-wide bus, throughput is enhanced. By comparison with systems using a multiple-flit-wide bus that supports returning credits on multiple flits of a transfer cycle, circuit complexity is reduced, thereby decreasing cost and increasing fabrication yield.

Figure 8:
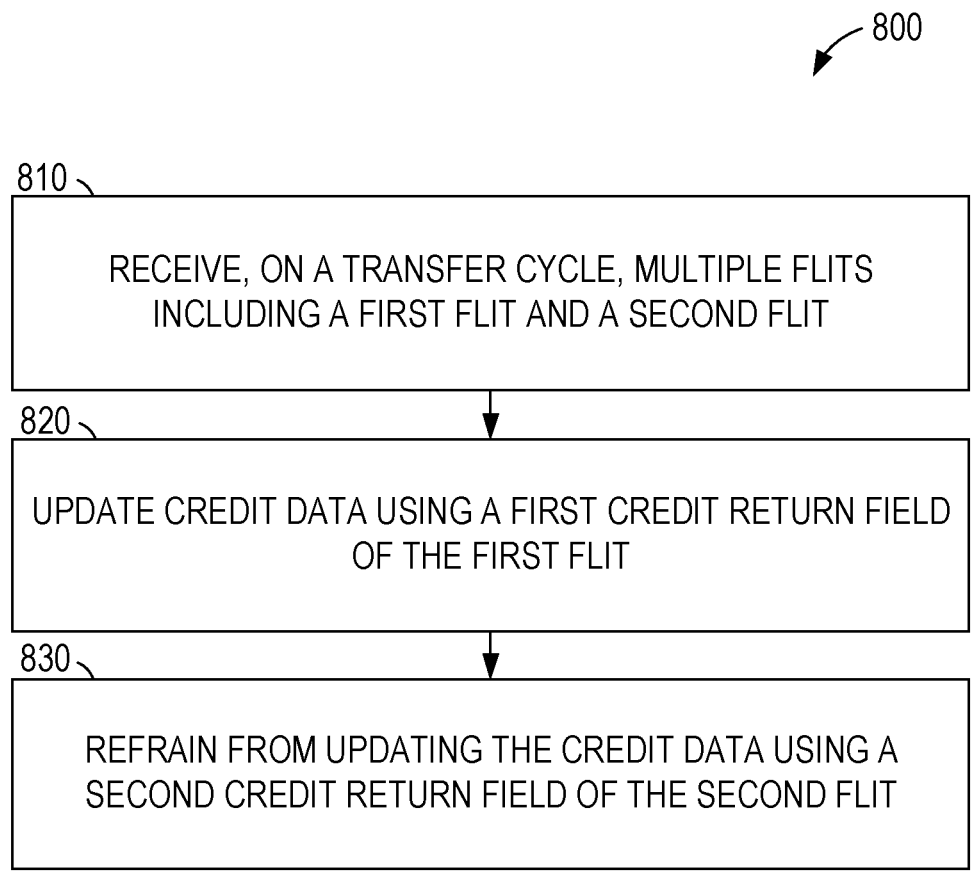
FIG. 8 is a flow chart showing operations of a method performed by a circuit in updating credit data, in accordance with some embodiments of the present disclosure.

FIG. 8 is a flow chart showing operations of a method 800 performed by a circuit in updating credit data, in accordance with some embodiments of the present disclosure. The method 800 includes operations 810, 820, and 830. By way of example and not limitation, the method 800 is described as being performed by the devices of FIGS. 1-3, using the data packet of FIG. 4.

In operation 810, a receiving device (e.g., the chiplet 310D of FIG. 3, implementing or communicating with the memory controller chiplet 205 of FIG. 2) receives, on a transfer cycle, multiple flits including a first flit and a second flit. For example, the receiving device may receive multiple flits sent over a CPI network by a transmitting device performing the method 700. The transfer cycle is a common duration defined by one or more clock cycles in which all of the multiple flits are received. Flits received during the common duration are received contemporaneously, even if not actually received simultaneously.

The receiving device, in operation 820, updates credit data using a first credit return field of the first flit. For example, the CR/RSV field 455 may contain credit return data for a virtual channel and the receiving device updates the number of available credits for the virtual channel using the credit return data.

In operation 830, the receiving device refrains from updating the credit data using a second credit return value of the second flit. For example, the CR/RSV field 465, transmitted on the same transfer cycle as the CR/RSV field 455, may be ignored by the receiving device. Using the first credit return field and ignoring the second credit return field may be based on a position of the first flit on a wide bus or the values of the first and second return values. For example, the flit in the first lane of the wide bus may be checked for credit return data and the flits in other lanes ignored. As another example, the credit return fields of all flits received on the transfer cycle may be logically-ORed together, such that the credit return field of any single flit will be unchanged if the credit return fields of all other flits were set to zero by the transmitting device. In this latter example, the transmitting device may provide credit return data on any lane, as long as credit return data is provided on only one lane.

In some example embodiments, the credit return fields of flits other than the first flit are verified to be zero (or otherwise not include credit return data) before or after updating the credit data in operation 820. In these example embodiments, the presence of credit return data in multiple flits received on a single transfer cycle may trigger error handling circuitry to raise an error condition for the receiving device, send an error response to the sending device, or both.

Various data formats may be used for the credit return data of the first flit. For example, the CR/RSV field 455 of FIG. 4 contains credit return data for a single virtual channel in a flit, but the CR3, CR2, CR1, and CR0 fields of the credit return data packet 500 of FIG. 5 contains credit return data for up to four virtual channels in a flit. The handling of the first credit return field in operation 820 may be part of handling all credit return fields of the first flit. Thus, support for the credit return data packet 500 is maintained, so long as only one flit returning credits is received per transfer cycle.

Operations of the method 800 may be performed by the credit checker and updater 290 of the transmitting device. By use of the method 800 in a receiving device coupled to a network that increases packet throughput by using a wide bus that transfers multiple flits per transfer cycle, no modification is made to the format of the flits, but the receiving device processes only credit returns credits of a single flit per transfer cycle. Thus, by comparison with systems using a single-flit-wide bus, throughput is enhanced. By comparison with systems using a multiple-flit-wide bus that supports returning credits on multiple flits of a transfer cycle, circuit complexity is reduced, thereby decreasing cost and increasing fabrication yield.

Figure 9:
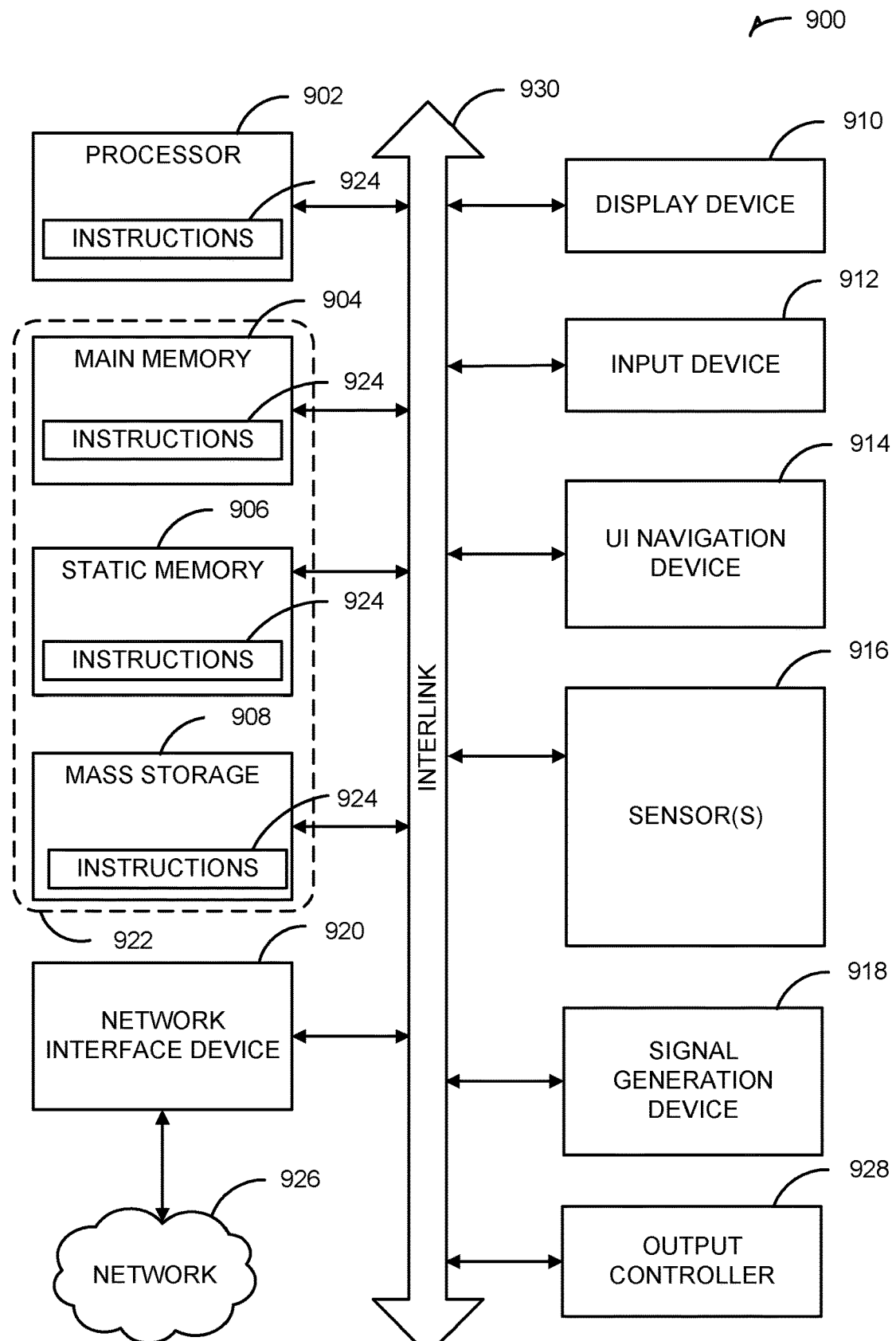
FIG. 9 is a block diagram of an example computer system in which embodiments of the present disclosure may operate.

FIG. 9 illustrates a block diagram of an example machine 900 with which, in which, or by which any one or more of the techniques (e.g., methodologies) discussed herein can be implemented. Examples, as described herein, can include, or can operate by, logic or a number of components, or mechanisms in the machine 900. Circuitry (e.g., processing circuitry) is a collection of circuits implemented in tangible entities of the machine 900 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time. Additional examples of these components with respect to the machine 900 follow.

In alternative embodiments, the machine 900 can operate as a standalone device or can be connected (e.g., networked) to other machines. In a networked deployment, the machine 900 can operate in the capacity of a server machine, a client machine, or both in server-client network environments. In an example, the machine 900 can act as a peer machine in peer-to-peer (P2P) (or other distributed) network environment. The machine 900 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 900 can include a hardware processor 902 (e.g., a central processing unit (CPU), a graphics processing unit (GPU), a hardware processor core, or any combination thereof), a main memory 904, a static memory (e.g., memory or storage for firmware, microcode, a basic-input-output (BIOS), unified extensible firmware interface (UEFI), etc.) 906, and mass storage 908 (e.g., hard drives, tape drives, flash storage, or other block devices), some or all of which can communicate with each other via an interlink (e.g., bus) 930. The machine 900 can further include a display unit 910, an alphanumeric input device 912 (e.g., a keyboard), and a user interface (UI) navigation device 914 (e.g., a mouse). In an example, the display unit 910, input device 912, and UI navigation device 914 can be a touch screen display. The machine 900 can additionally include a signal generation device 918 (e.g., a speaker), a network interface device 920, and one or more sensors 916, such as a global positioning system (GPS)

sensor, compass, accelerometer, or other sensor. The machine 900 can include an output controller 928, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 902, the main memory 904, the static memory 906, or the mass storage 908 can be, or include, a machine readable medium 922 on which is stored one or more sets of data structures or instructions 924 (e.g., software) embodying or utilized by any one or more of the techniques or functions described herein. The instructions 924 can also reside, completely or at least partially, within any of registers of the processor 902, the main memory 904, the static memory 906, or the mass storage 908 during execution thereof by the machine 900. In an example, one or any combination of the hardware processor 902, the main memory 904, the static memory 906, or the mass storage 908 can constitute the machine readable media 922. While the machine readable medium 922 is illustrated as a single medium, the term "machine readable medium" can include a single medium or multiple media (e.g., a centralized or distributed database, or associated caches and servers) configured to store the one or more instructions 924.

The term "machine readable medium" can include any medium that is capable of storing, encoding, or carrying instructions for execution by the machine 900 and that cause the machine 900 to perform any one or more of the techniques of the present disclosure, or that is capable of storing, encoding or carrying data structures used by or associated with such instructions. Non-limiting machine readable medium examples can include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media can include non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and compact disc read only memory (CD-ROM) and digital versatile disc read only memory (DVD-ROM) disks.

In an example, information stored or otherwise provided on the machine readable medium 922 can be representative of the instructions 924, such as instructions 924 themselves or a format from which the instructions 924 can be derived. This format from which the instructions 924 can be derived can include source code, encoded instructions (e.g., in compressed or encrypted form), packaged instructions (e.g., split into multiple packages), or the like. The information representative of the instructions 924 in the machine readable medium 922 can be processed by processing circuitry into the instructions to implement any of the operations discussed herein. For example, deriving the instructions 924 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 924.

In an example, the derivation of the instructions 924 can include assembly, compilation, or interpretation of the information (e.g., by the processing circuitry) to create the instructions 924 from some intermediate or preprocessed format provided by the machine readable medium 922. The information, when provided in multiple parts, can be combined, unpacked, and modified to create the instructions 924. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 924 can be further transmitted or received over a communications network 926 using a transmission medium via the network interface device 920 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 920 can include one or more physical jacks (e.g., Ethernet, coaxial, or phone jacks) or one or more antennas to connect to the communications network 926. In an example, the network interface device 920 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 900, and includes digital or analog communications signals or other intangible medium to facilitate communication of such software. A transmission medium is a machine readable medium.

In the foregoing specification, some example implementations of the disclosure have been described. It will be evident that various modifications can be made thereto without departing from the broader scope and spirit of the disclosure as set forth in the following claims. The specification and drawings are, accordingly, to be regarded in an illustrative sense rather than in a restrictive sense. Below is a non-exhaustive list of examples of implementations of the present disclosure.

Example 1 is a system comprising: a memory device; a memory controller coupled to the memory device; and logic configured to perform operations comprising: contemporaneously receiving multiple flow control units (flits) including a first flit and a second flit, the first flit having a first credit return field, and the second flit having a second credit return field; updating credit data using credits indicated in only one of the first credit return field of the first flit and the second credit return field of the second flit.

In Example 2, the subject matter of Example 1 includes, wherein the operations further comprise: determining to update the credit data using the first credit return field and to not update the credit data using the second credit return field based on a first lane of the first flit and a second lane of the second flit.

In Example 3, the subject matter of Examples 1-2 includes, wherein the operations further comprise: before updating the credit data using the first credit return field, verifying that the second credit return field has a value of zero.

In Example 4, the subject matter of Examples 1-3 includes, wherein: the multiple flits include a third flit having a third credit return field; the operations further comprise determining which credit return field of the multiple flits contains indicated credits; and the updating of the credit data using credits indicated in only one of the first credit return field of the first flit and the second credit return field of the second flit is in response to determining that only the second credit return field of the second flit indicates credits and comprises updating the credit data using only credits indicated by the second credit return field of the second flit.

In Example 5, the subject matter of Examples 1-4 includes, wherein the operations further comprise: combining the first credit return field of the first flit with the second credit return field of the second flit using a bitwise-OR operation.

In Example 6, the subject matter of Examples 1-5 includes, wherein the operations further comprise: identifying a virtual channel from the first flit; and wherein the updating of the credit data comprises updating credit data for the identified virtual channel.

In Example 7, the subject matter of Examples 1-6 includes, wherein the operations further comprise: identifying a first virtual channel, a first number of credits, a second virtual channel, and a second number of credits from the first flit; and wherein the updating of the credit data comprises updating credit data for the first virtual channel using the first number of credits and updating credit data for the second virtual channel using the second number of credits.

In Example 8, the subject matter of Example 7 includes, wherein: the identifying of the first virtual channel comprises determining, from a 1-bit first field of the first flit, whether the first number of credits is for the first virtual channel or a third virtual channel; and the identifying of the second virtual channel comprises determining, from a 1-bit second field of the first flit, whether the second number of credits is for the second virtual channel or a fourth virtual channel.

In Example 9, the subject matter of Examples 1-8 includes, wherein the receiving of the multiple flits comprises receiving the multiple flits via a Chiplet Protocol Interface (CPI).

Example 10 is a method comprising: contemporaneously receiving, during a common duration defined by one or more clock cycles, multiple flow control units (flits) including a first flit and a second flit, the first flit having a first credit return field, and the second flit having a second credit return field; and updating credit data using credits indicated in only one of the first credit return field of the first flit and the second credit return field of the second flit.

In Example 11, the subject matter of Example 10 includes, determining to update the credit data using the first credit return field and to not update the credit data using the second credit return field based on a first lane of the first flit and a second lane of the second flit.

In Example 12, the subject matter of Examples 10-11 includes, before updating the credit data using the first credit return field, verifying that the second credit return field has a value of zero.

In Example 13, the subject matter of Examples 10-12 includes, wherein: the multiple flits include a third flit having a third credit return field; the method further comprises determining which credit return field of the multiple flits contains indicated credits; and the updating of the credit data using credits indicated in only one of the first credit return field of the first flit and the second credit return field of the second flit is in response to determining that only the second credit return field of the second flit indicates credits and comprises updating the credit data using only credits indicated by the second credit return field of the second flit.

In Example 14, the subject matter of Examples 10-13 includes, combining the first credit return field of the first flit with the second credit return field of the second flit using a bitwise-OR operation.

In Example 15, the subject matter of Examples 10-14 includes, identifying a virtual channel from the first flit; and wherein the updating of the credit data comprises updating credit data for the identified virtual channel.

In Example 16, the subject matter of Examples 10-15 includes, identifying a first virtual channel, a first number of credits, a second virtual channel, and a second number of credits from the first flit; and wherein the updating of the credit data comprises updating credit data for the first virtual channel using the first number of credits and updating credit data for the second virtual channel using the second number of credits.

In Example 17, the subject matter of Example 16 includes, wherein: the identifying of the first virtual channel comprises determining, from a 1-bit first field of the first flit, whether the first number of credits is for the first virtual channel or a third virtual channel; and the identifying of the second virtual channel comprises determining, from a 1-bit second field of the first flit, whether the second number of credits is for the second virtual channel or a fourth virtual channel.

In Example 18, the subject matter of Examples 10-17 includes, wherein the receiving of the multiple flits comprises receiving the multiple flits via a Chiplet Protocol Interface (CPI).

Example 19 is a non-transitory machine-readable medium that stores instructions that, when executed by a system, cause the system to perform operations comprising: contemporaneously receiving, during a common duration defined by one or more clock cycles, multiple flow control units (flits) including a first flit and a second flit, the first flit having a first credit return field, and the second flit having a second credit return field; and updating credit data using credits indicated in only one of the first credit return field of the first flit and the second credit return field of the second flit.

In Example 20, the subject matter of Example 19 includes, wherein the operations further comprise: determining to update the credit data using the first credit return field and to not update the credit data using the second credit return field based on a first lane of the first flit and a second lane of the second flit.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

What is claimed is:

1. A system comprising:
   a memory device;
   a memory controller coupled to the memory device; and
   logic configured to perform operations comprising:
     contemporaneously receiving, via a Chiplet Protocol Interface (CPI), multiple flow control units (flits) including a first flit and a second flit, the first flit having a first credit return field, and the second flit having a second credit return field;
     determining, based on a first lane of the first flit and a second lane of the second flit, to update credit data using credits indicated in the first credit return field and to not update the credit data using the second credit return field; and
     based on the determining, updating the credit data using credits indicated in the first credit return field and not the second credit return field.

2. The system of claim 1, wherein the updating of the credit data using the first credit return field is further based on verifying that the second credit return field has a value of zero.

3. The system of claim 1, wherein:
   the multiple flits include a third flit having a third credit return field;
   the operations further comprise determining which credit return field of the multiple flits contains indicated credits; and
   the updating of the credit data using credits indicated in only one of the first credit return field of the first flit and the second credit return field of the second flit is in response to determining that only the second credit return field of the second flit indicates credits and comprises updating the credit data using only credits indicated by the second credit return field of the second flit.

4. The system of claim 1, wherein the operations further comprise:
   combining the first credit return field of the first flit with the second credit return field of the second flit using a bitwise-OR operation.

5. The system of claim 1, wherein the operations further comprise:
   identifying a virtual channel from the first flit; and
   wherein the updating of the credit data comprises updating credit data for the identified virtual channel.

6. The system of claim 1, wherein the operations further comprise:
   identifying a first virtual channel, a first number of credits, a second virtual channel, and a second number of credits from the first flit; and
   wherein the updating of the credit data comprises updating credit data for the first virtual channel using the first number of credits and updating credit data for the second virtual channel using the second number of credits.

7. The system of claim 6, wherein:
   the identifying of the first virtual channel comprises determining, from a 1-bit first field of the first flit, whether the first number of credits is for the first virtual channel or a third virtual channel; and
   the identifying of the second virtual channel comprises determining, from a 1-bit second field of the first flit, whether the second number of credits is for the second virtual channel or a fourth virtual channel.

8. A method comprising:
   contemporaneously receiving, during a common duration defined by one or more clock cycles and via a Chiplet Protocol Interface (CPI), multiple flow control units (flits) including a first flit and a second flit, the first flit having a first credit return field, and the second flit having a second credit return field;
   determining, based on a first lane of the first flit and a second lane of the second flit, to update credit data using credits indicated in the first credit return field and to not update the credit data using the second credit return field; and
   based on the determining, updating the credit data using credits indicated in the first credit return field and not the second credit return field.

9. The method of claim 8, wherein the updating of the credit data using the first credit return field is further based on verifying that the second credit return field has a value of zero.

10. The method of claim 8, wherein:
    the multiple flits include a third flit having a third credit return field;
    the method further comprises determining which credit return field of the multiple flits contains indicated credits; and
    the updating of the credit data using credits indicated in only one of the first credit return field of the first flit and the second credit return field of the second flit is in response to determining that only the second credit return field of the second flit indicates credits and comprises updating the credit data using only credits indicated by the second credit return field of the second flit.

11. The method of claim 8, further comprising:
    combining the first credit return field of the first flit with the second credit return field of the second flit using a bitwise-OR operation.

12. The method of claim 8, further comprising:
    identifying a virtual channel from the first flit; and
    wherein the updating of the credit data comprises updating credit data for the identified virtual channel.

13. The method of claim 8, further comprising:
    identifying a first virtual channel, a first number of credits, a second virtual channel, and a second number of credits from the first flit; and
    wherein the updating of the credit data comprises updating credit data for the first virtual channel using the first number of credits and updating credit data for the second virtual channel using the second number of credits.

14. The method of claim 13, wherein:
    the identifying of the first virtual channel comprises determining, from a 1-bit first field of the first flit, whether the first number of credits is for the first virtual channel or a third virtual channel; and
    the identifying of the second virtual channel comprises determining, from a 1-bit second field of the first flit, whether the second number of credits is for the second virtual channel or a fourth virtual channel.

15. A non-transitory machine-readable medium that stores instructions that, when executed by a system, cause the system to perform operations comprising:
    contemporaneously receiving, during a common duration defined by one or more clock cycles and via a Chiplet Protocol Interface (CPI), multiple flow control units (flits) including a first flit and a second flit, the first flit having a first credit return field, and the second flit having a second credit return field;

determining, based on a first lane of the first flit and a second lane of the second flit, to update credit data using credits indicated in the first credit return field and to not update the credit data using the second credit return field; and based on the determining, updating the credit data using credits indicated in the first credit return field and not the second credit return field.

16. The non-transitory machine-readable medium of claim 15, wherein the updating of the credit data using the first credit return field is further based on verifying that the second credit return field has a value of zero.

17. The non-transitory machine-readable medium of claim 15, wherein the operations further comprise:

combining the first credit return field of the first flit with the second credit return field of the second flit using a bitwise-OR operation.

18. The non-transitory machine-readable medium of claim 15, wherein:

the multiple flits include a third flit having a third credit return field;

the operations further comprise determining which credit return field of the multiple flits contains indicated credits; and the updating of the credit data using credits indicated in only one of the first credit return field of the first flit and the second credit return field of the second flit is in response to determining that only the second credit return field of the second flit indicates credits and comprises updating the credit data using only credits indicated by the second credit return field of the second flit.

19. The non-transitory machine-readable medium of claim 15, wherein the operations further comprise:

identifying a virtual channel from the first flit; and wherein the updating of the credit data comprises updating credit data for the identified virtual channel.

20. The non-transitory machine-readable medium of claim 15, wherein the operations further comprise:

identifying a first virtual channel, a first number of credits, a second virtual channel, and a second number of credits from the first flit; and wherein the updating of the credit data comprises updating credit data for the first virtual channel using the first number of credits and updating credit data for the second virtual channel using the second number of credits.

* * * * *